United States Patent
Chiang et al.

(10) Patent No.: US 7,382,162 B2
(45) Date of Patent: Jun. 3, 2008

(54) HIGH-DENSITY LOGIC TECHNIQUES WITH REDUCED-STACK MULTI-GATE FIELD EFFECT TRANSISTORS

(75) Inventors: Meng-Hsueh Chiang, Yilan (TW); Ching-Te Kent Chuang, South Salem, NY (US); Keunwoo Kim, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 299 days.

(21) Appl. No.: 11/181,954

(22) Filed: Jul. 14, 2005

(65) Prior Publication Data

US 2007/0013413 A1    Jan. 18, 2007

(51) Int. Cl.
H03K 19/20 (2006.01)
H03K 19/094 (2006.01)

(52) U.S. Cl. .................. 326/121; 326/112; 326/119

(58) Field of Classification Search ............. None
See application file for complete search history.

(56) References Cited

U.S. PATENT DOCUMENTS

| | | | | |
|---|---|---|---|---|
| 4,851,714 | A * | 7/1989 | Hwang | 326/98 |
| 7,112,997 | B1 * | 9/2006 | Liang et al. | 326/81 |
| 2006/0281268 | A1 * | 12/2006 | Colinge et al. | 438/301 |
| 2006/0290383 | A1 * | 12/2006 | Chuang et al. | 326/97 |
| 2006/0290384 | A1 * | 12/2006 | Chuang et al. | 326/97 |
| 2007/0040584 | A1 * | 2/2007 | Ngo et al. | 326/98 |

OTHER PUBLICATIONS

Meng-Hsueh Chiang, Keunwoo Kim, Christophe Tretz, Ching-Te Chuang□□Novel High-Density Low-Power High-Performance Double-Gate Logic Techniques□□2004 IEEE International SOI COnference Oct. 2004, pp. 122-123□□0-7803-8498-9/04 (2004 IEEE).*

Meng-Hsueh Chiang, Keunwoo Kim, Christophe Tretz, Ching-Te Chuang□□Novel High-Density Low-Power High-Performance Double-Gate Logic Techniques □□2004 IEEE International SOI COnference Oct. 2004, pp. 122-123 □□0-7803-8498-9/04 (2004 IEEE).*

Chen et al., "Scaling of CMOS FinFETs Towards 10 nm," Proc. Internat. Symp. VLSI Tech. Sys. Appl. (VLSI-TSA), pp. 46-48, Hsinchu, Taiwan, ROC (Oct. 2003).

Chiang et al., "Novel High-Density Low-Power High-Performance Double-Gate Logic Technique," Proc. IEEE Internat. SOI Conf., Charleston, SC (Oct. 2004).

Yang et al., "5nm-Gate Nanowire FinFET," Tech. Papers, Symp, VLSI Tech., pp. 196-197, Honolulu, HI (Jun. 2004).

* cited by examiner

*Primary Examiner*—Rexford Barnie
*Assistant Examiner*—Dylan White
(74) *Attorney, Agent, or Firm*—Ryan, Mason & Lewis, LLP (57) ABSTRACT

Techniques for employing multi-gate field effect transistors (FETS) in logic circuits formed from logic gates are provided. Double-gate transistors that conduct only when both transistor gates are active can be used to reduce the number of devices hitherto required in series or "stacked" portions of logic gates. Circuit area can be reduced and performance can be enhanced.

4 Claims, 11 Drawing Sheets

2-WAY NAND

*FIG. 4*

2-WAY NOR

FIG. 5
2-WAY NAND

FIG. 6
2-WAY NOR

ALL HIGH $V_T$ (SERIES) PFETS

ALL REGULAR $V_T$ (PARALLEL) NFETS

4-WAY NOR

FIG. 10

ALL HIGH $V_T$ (SERIES) PFETS

ALL REGULAR $V_T$ (PARALLEL) NFETS

6-WAY NOR

FIG. 11 INVERSION-MODE DG NFET

FIG. 12 ACCUMULATION-MODE DG NFET

FIG. 13 SG MODE (1 CHANNEL)

FIG. 14 DG MODE (2 CHANNELS)

HIGH-DENSITY LOGIC TECHNIQUES WITH REDUCED-STACK MULTI-GATE FIELD EFFECT TRANSISTORS

STATEMENT REGARDING FEDERALLY SPONSORED RESEARCH OR DEVELOPMENT

This invention was made with Government support under Contract Number NBCH30390004 awarded by the Defense Advanced Research Projects Agency (DARPA). The Government has certain rights in this invention.

FIELD OF THE INVENTION

The present invention generally relates to electronic circuitry and, more particularly, to digital logic circuitry.

BACKGROUND OF THE INVENTION

Figure 1:
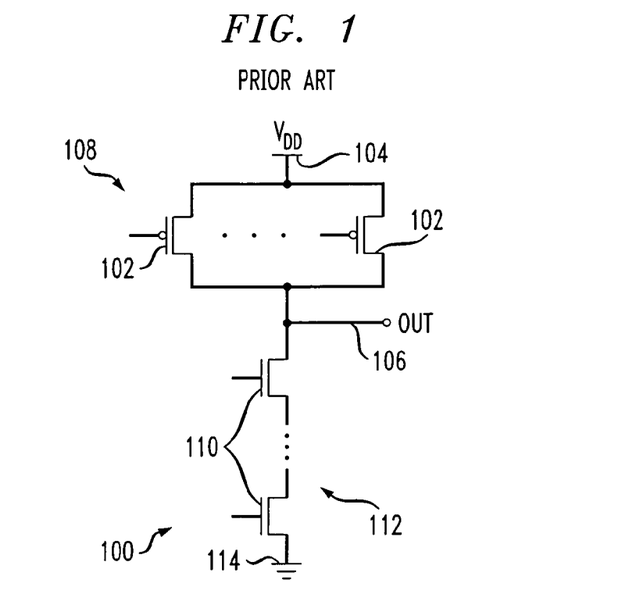
FIG. 1 shows a prior-art NAND gate.

Digital logic circuits may be constructed, for example, using complementary metal oxide semiconductor (CMOS) technology. With reference to FIG. 1, in a typical NAND gate 100, a plurality of field effect transistors (FETS) of the p-type (PFETS) 102 can be connected together in parallel between a voltage source 104 and an output 106, to form a first, parallel portion 108. Gates of the PFETS 102 are connected to input terminals, and if any input is active (i.e., in a "LOW" state for a PFET), the supply voltage ($V_{DD}$) at 104 will appear on the output 106. Prior art NAND gates also include a plurality of n-type FETS (NFETS) 110 interconnected in series or "stacked" fashion to form a second, stacked portion 112. Only if all inputs are active (i.e., "HIGH" for NFETS 110) will output 106 be grounded through stacked portion 112 to ground terminal 114.

Figure 2:
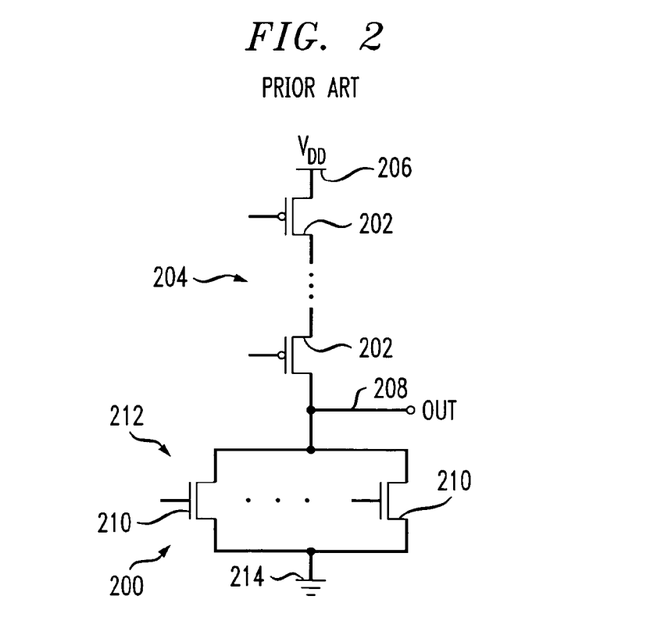
FIG. 2 shows a prior-art NOR gate.

Referring now to FIG. 2, in a prior art NOR gate 200, a number of PFETS 202 may be interconnected in series or stacked fashion to form a stacked portion 204 between a voltage supply terminal 206 and an output terminal 208. Furthermore, a plurality of NFETS 210 may be connected in parallel to form a parallel portion 212 between output terminal 208 and ground terminal 214.

It would be desirable to reduce the amount of area occupied by each logic gate. Furthermore, in conventional circuits, the size (i.e., area) for stacked devices must generally be increased to reduced the ON resistance of the gate; this leads to a practical limit on the number of inputs that can be realized in conventional NAND and NOR gates.

SUMMARY OF THE INVENTION

Principles of the present invention provide techniques for realizing high-density logic circuits using multi-gate FETS.

An exemplary embodiment of a logic gate, according to one aspect of the present invention, can include at least first and second input terminals, an output terminal, a voltage supply terminal, and a ground terminal. Furthermore, the gate can include a first portion that has at least one FET of a first type (either p-type or n-type). The first portion can be configured to electrically interconnect the output terminal with the voltage supply terminal or the ground terminal, upon activation by at least one of the input terminals. Furthermore, the gate can include a second portion. The second portion can include at least one multi-gate FET that is of a second type (either p-type or n-type) that is different than the first type. The multi-gate FET can have at least a first gate electrically interconnected to the first input terminal and a second gate electrically interconnected to the second input terminal. The multi-gate FET can form at least part of a path between the output terminal and the voltage supply terminal or the ground terminal (whichever the first portion is not interconnected with). The second portion can be configured such that it conducts, in a logical sense, only when both the first and second gates are activated by the first and second inputs.

One or more embodiments of the present invention may be realized in the form of an integrated circuit.

An exemplary method of designing a logic gate, according to another aspect of the present invention, includes the steps of identifying a function that requires electrical interconnection of two terminals only upon activation by all of at least two inputs, and specifying a multi-gate FET to perform the function, where the multi-FET has a number of gates equal to the number of inputs and is configured to conduct, in a logical sense, only upon activation of all the gates by all the inputs.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

Figure 3:
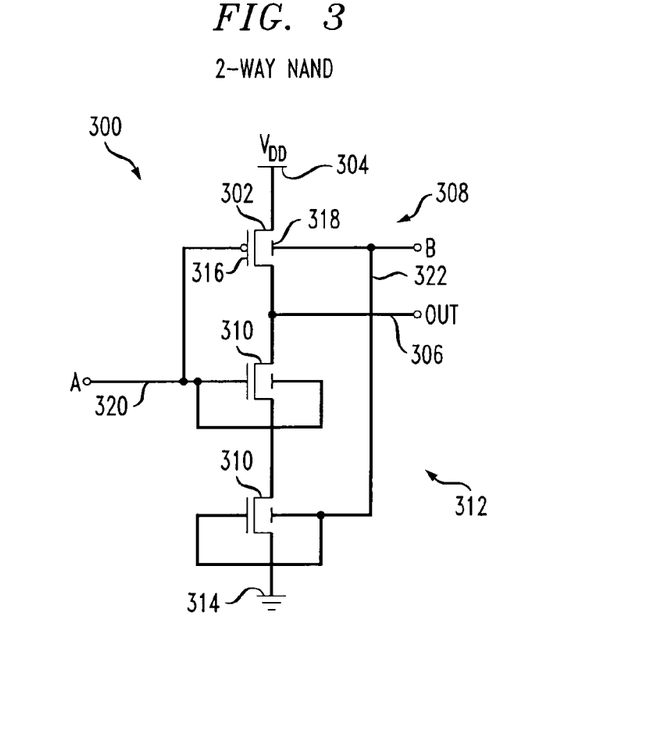
FIG. 3 shows a NAND gate employing a double-gate PFET.

FIG. 3 shows a two-way NAND gate 300. Items similar to those in FIG. 1 have received the same reference character incremented by 200. In order to save space, parallel portion 308 is formed using a single double-gate PFET 302. Double-gate PFET 302 is configured to conduct upon activation of either of gates 316, 318 by either of inputs A, B, numbered, respectively, 320, 322. NFETS 310 are illustrated as double-gate NFETS but with both gates tied together so that they effectively function as conventional NFETS (conventional NFETS could have been depicted instead). Note that the term "gate" is used herein to refer to one of the terminals of a FET, and also to a logic circuit that performs a specified logic function, such as NAND or NOR. The usage will be clear from the context.

Figure 4:
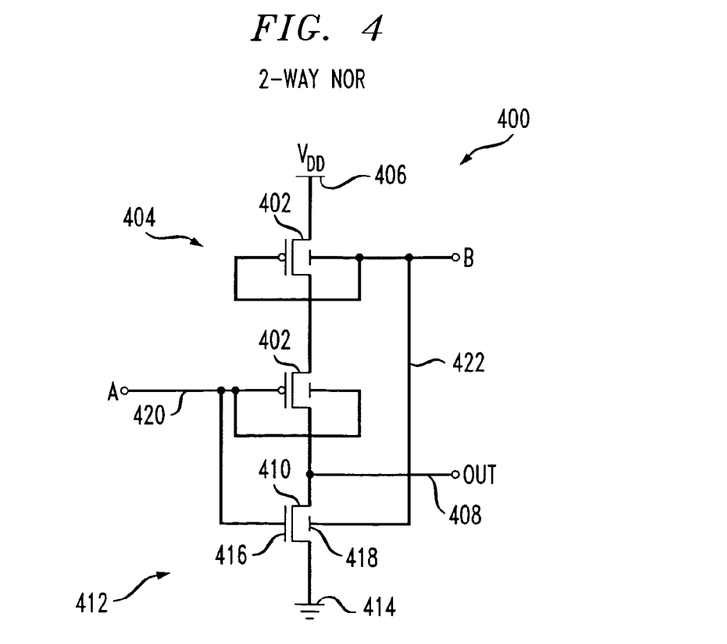
FIG. 4 shows a NOR gate employing a double-gate NFET.

FIG. 4 shows a two-way NOR gate 400. Elements similar to those in FIG. 2 have received the same reference character incremented by 200. The two parallel NFETS have been replaced by a single double-gate NFET 410 which becomes conductive upon activation of either of gates 416, 418 by either of inputs A, B, numbered, respectively, 420, 422. PFETS 402 are shown as double-gate PFETS having the gates tied together to function in a conventional manner; however, conventional PFETS could also have been depicted.

The devices shown in FIGS. 3 and 4 can achieve some beneficial reduction in circuit area, but still employ conventional techniques for the "stacked" or series portions 312, 404.

Figure 5:
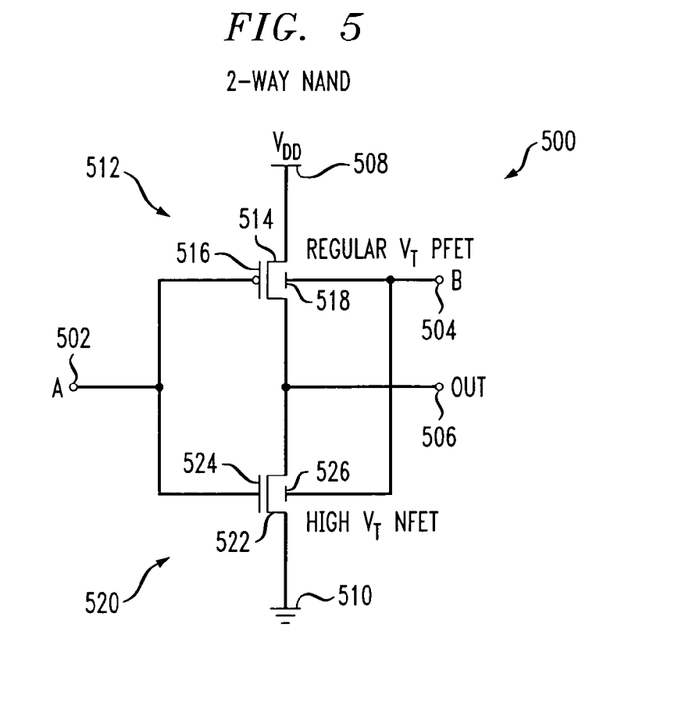
FIG. 5 shows an exemplary embodiment of two-way NAND gate according to an aspect of the present invention.

Attention should now be given to FIG. 5, which depicts an exemplary embodiment of a two-way NAND gate 500 in accordance with an aspect of the present invention. Gate 500 includes at least first and second input terminals A, B, numbered, respectively, 502, 504, as well as output terminal 506, voltage supply terminal 508, and ground terminal 510. Gate 500 further includes a first portion 512 with at least one FET 514 of a first type, which in a general case is either p-type or n-type. In the exemplary NAND gate, first FET 514 is of the p-type, portion 512 is essentially parallel in nature, and portion 512 is configured to electrically interconnect the output terminal 506 with the voltage supply terminal 508 when at least one of the first and second input terminals 502, 504 is activated. Thus, gate 500 can employ, for example, a PFET 514 having a conventional threshold voltage characteristic, that becomes conductive when either gate 516, 518 thereof is activated (i.e., "LOW" for a PFET or "HIGH" for an NFET). The FETS employed with one or more embodiments of the present invention can be, for example, metal oxide semiconductor FETS (MOSFETS). Note that the terms "input" and "input terminal" may be used somewhat interchangeably herein; an input terminal refers to a physical portion of a circuit upon which a signal such as a voltage may be applied. An input can refer to both such a terminal and the signal that is applied thereto. The meaning will be apparent from the context.

Gate 500 can further include a second portion 520 that in turn includes at least one multi-gate FET 522 of a first type. The second type is, in the general case, either p-type or n-type, and is different than the first type; in the exemplary two-way NAND gate 500 of FIG. 5, the second type is n-type. FET 522 has at least a first gate 524 electrically interconnected to the first input terminal 502 and a second gate 526 electrically interconnected to the second input terminal 504. Of course, it will be appreciated that transistors 514, 522 are also configured with drain and source terminals. The multi-gate FET 522 forms at least part of a path between the output terminal 506 and the ground terminal 510. Transistor 522 is of a type that becomes conductive, in a logical sense, only when the first and second gates 524, 526 are activated by the first and second inputs 502, 504. In one or more embodiments of the present invention, the second transistor 522 can be realized as a high threshold voltage (high $V_T$) NFET of a kind to be discussed below. It should be understood that any multi-gate device, such as a double-gate device, may become slightly conductive when only a single gate thereof is activated. However, such devices, as will be discussed below, can be formed such that the slight conduction does not affect functioning of the logic circuit and the logic circuit will still function as if the device was off unless all (both for a double-gate device) gates are activated. This is what is meant by "conduction in a logical sense" as used throughout this patent application, including the claims thereof. Second portion 520 is thus series or "stacked" in nature, in that, even though it includes only a single device, it behaves as two conventional devices in series (or stacked) configuration would, i.e., conducts logically only with both gates active.

Figure 6:
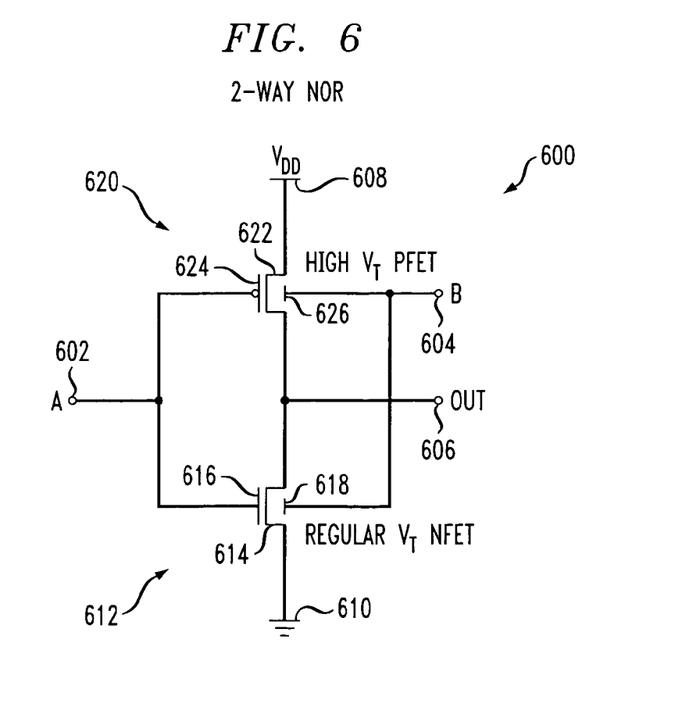
FIG. 6 shows an exemplary embodiment of a two-way NOR gate according to an aspect of the present invention.

Turning attention now to FIG. 6, an exemplary embodiment of a two-way NOR gate 600, according to an aspect of the present invention, is depicted therein. NOR gate 600 includes terminals 602-610 analogous to terminals 502-510 discussed above with respect to NAND gate 500. A first portion 612 includes at least one FET 614 that is of a first type; in the general case, either p-type or n-type. In the exemplary two-way NOR gate of FIG. 600, the first FET 614 is of the n-type. The first portion 612 is configured to electrically interconnect the output terminal 606 with the ground terminal 610 upon activation by at least one of the input terminals A, B, numbered, respectively, 602, 604. In the exemplary embodiment shown in FIG. 6, FET 614 can be a double-gate NFET having a conventional threshold voltage, which becomes conductive when either of its gates 616, 618 is activated (i.e., goes "HIGH" for an NFET; activation for a PFET would constitute going "LOW").

NOR gate 600 further includes a second portion 620 that is essentially "series" or "stacked" in nature and includes at least one multi-gate FET 622 of a second type, that is either p-type or n-type, and that is different from first FET 614. The at least one multi-gate FET of the second type has at least a first gate 624 that is electrically interconnected to the first input terminal 602 and a second gate 626 that is electrically interconnected to the second input terminal 604. The multi-gate FET 622 of the second type forms at least part of a path between the output terminal 606 and the voltage supply terminal 608. The FET 622 is configured such that the part of the path becomes conductive, in a logical sense, only when both first and second gates 624, 626 are activated by first and second inputs 602, 604 respectively.

It will be appreciated that in FIGS. 5 and 6, a multi-gate FET, such as a double-gate FET, can take the place of two (or more) stacked devices and can be configured to become logically conductive only when all the required inputs are activated. The exemplary embodiments of FIGS. 5 and 6 are shown using multi-gate FETS with a regular threshold voltage, which conduct when either gate is activated, for the parallel portions. If desired, a number of ordinary single-gate FETS could instead by employed for the parallel portions and the series or stacked portions could use the multi-gate FET technology. However, it is presently believed desirable to take advantage of the use of multi-gate FETS for both the parallel and stacked or series portions.

At present, it is believed that devices (e.g., multi-gate FETS) having more than two gates may be useful for logic gates having more than two inputs, where such devices are configured to become conductive, in a logical sense, only when all the required number of inputs are activated. Double-gate FETS are depicted in the exemplary embodiments throughout the present application.

Figure 7:
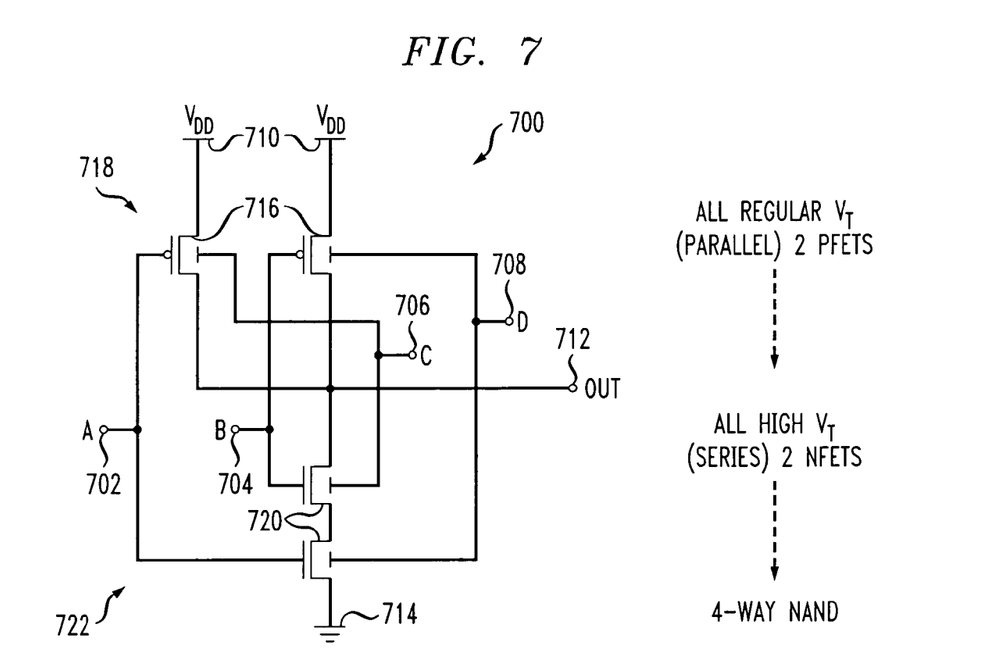
FIG. 7 shows an exemplary embodiment of a four-way NAND gate according to an aspect of the present invention.

FIG. 7 depicts an exemplary embodiment of a four-way NAND gate according to an aspect of the present invention. The gate 700 includes first, second, third and fourth inputs A, B, C, D, numbered, respectively, 702, 704, 706, 708. It will be appreciated that, throughout this application, including the claims, the designation of inputs as first, second, third, fourth, fifth, sixth (or A, B, C, D, E, F) and the like is arbitrary and any input may have any desired number or letter associated therewith. Gate 700 further includes voltage supply terminal(s) 710, output terminal 712, and ground terminal 714. Note that multiple voltage supply terminals at the same voltage may equivalently be formed as a single terminal, as may multiple ground terminals. It will be appreciated that, wherever a ground terminal is mentioned, it is intended in a relative sense compared to the pertinent voltage supply terminals and nodes in the particular depiction. Gate 700 includes two double-gate PFETS 716 connected in parallel between the voltage supply terminal(s) 710 and the output terminal 712. PFETS 716 form a first (or parallel) portion 718 that interconnects the voltage supply terminal(s) with the output terminal 712 whenever any one of inputs 702, 704, 706, 708 is active (i.e., in a "LOW" state for a PFET). Gate 700 further includes two double-gate NFETS 720 connected in series between output terminal 712 and ground terminal 714, and forming a second or stacked/series portion 722. Portion 722 interconnects output terminal 712 with ground terminal 714 only when activated by all of input gates 702, 704, 706, 708. That is, the NFETS 720 are of the type that conduct, in a logical sense, only when both gates are "HIGH." PFETS 716 can be conventional threshold voltage PFETS, while NFETS 720 can be high threshold voltage NFETS. When a device is referred to as having a "HIGH" threshold voltage, such comparison is intended to be with respect to the FETS of the other type in the exemplary logic gate. That is, in FIG. 700, NFETS 720 have a high threshold voltage as compared to PFETS 716.

Figure 8:
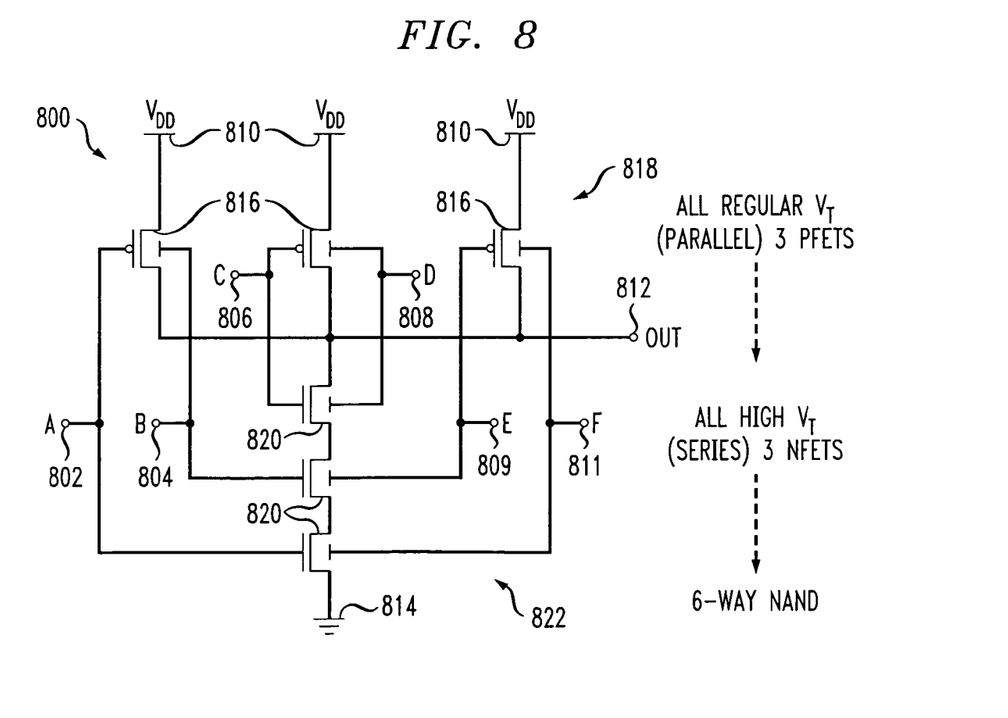
FIG. 8 shows an exemplary embodiment of a six-way NAND gate according to an aspect of the present invention.

With reference to FIG. 8, an exemplary six-way NAND gate 800 according to an aspect of the present invention is depicted therein. Items similar to those in FIG. 7 are given the same reference character incremented by 100. Construction and operation are similar to the four-way NAND gate depicted in FIG. 7, except that additional inputs E, F, numbered, respectively, 809, 811 are provided and sections 818, 822 each include, respectively, an additional PFET 816 or NFET 820. It will appreciated that portion 818 causes interconnection of the output terminal and the voltage supply when activated by any of the six inputs, while portion 722 causes the output terminal to be grounded only when activated by all of the six inputs.

Figure 9:
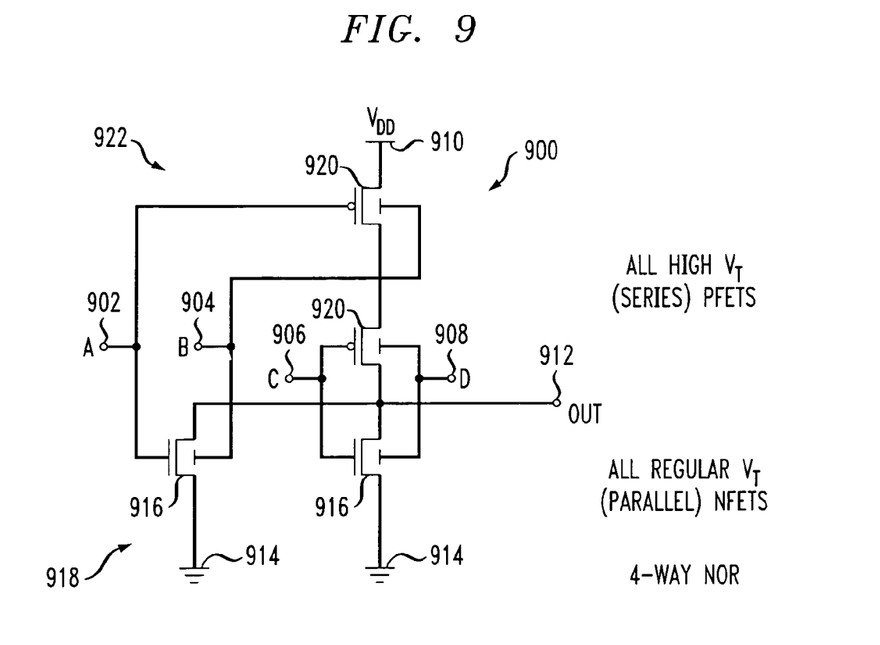
FIG. 9 shows an exemplary embodiment of a four-way NOR gate according to an aspect of the present invention.

FIG. 9 shows an exemplary embodiment of a four-way NOR gate 900 according to an aspect of the present invention. Gate 900 includes input terminals A, B, C, D, numbered, respectively, 902, 904, 906, 908. Gate 900 further includes voltage supply terminal 910, output terminal 912, and ground terminal(s) 914. Gate 900 can include first and second NFETS 916 connected in parallel between output 912 and ground 914 and forming a first or parallel portion 918. NFETS 916 can be conventional threshold voltage NFETS. Gate 900 further includes PFETS 920 connected in series between voltage supply terminal 910 and output terminal 912, and forming a second, series or "stacked" portion 922. PFETS 920 can be high threshold voltage PFETS. Portion 918 can ground output 912 when activated by any of the inputs 902, 904, 906, 908. Portion 922 interconnects output terminal 912 with supply voltage 910 only when activated by all of the inputs 902, 904, 906, 908.

Figure 10:
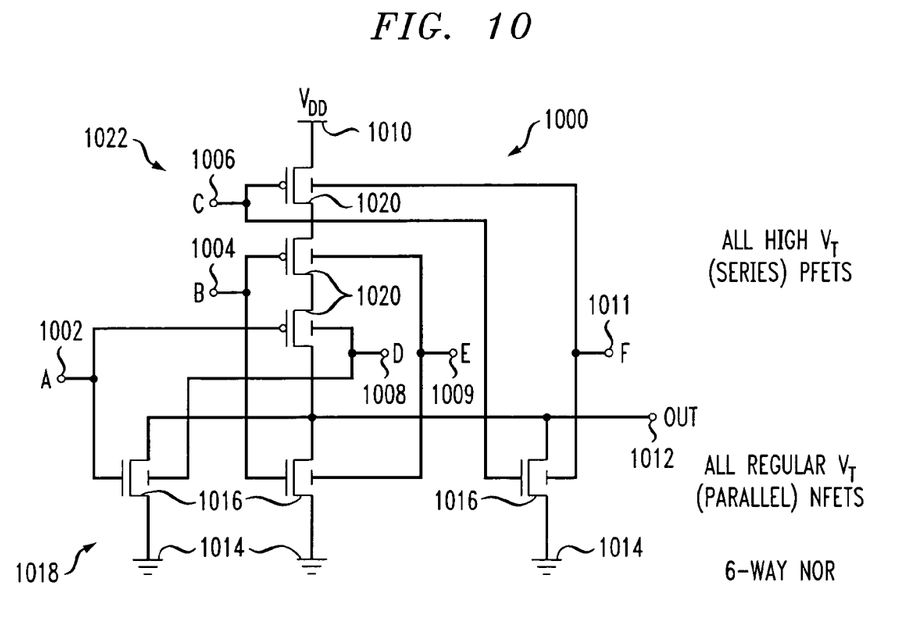
FIG. 10 shows an exemplary embodiment of a six-way NOR gate according to an aspect of the present invention.

Giving attention now to FIG. 10, wherein elements similar to those in FIG. 9 have received the same reference character incremented by 100, an exemplary embodiment of a six-way NOR gate, according to an aspect of the present invention, is depicted therein. The construction and functioning of six-way NOR gate 1000 is similar to that of four-way NOR gate 900, except that additional input terminals E, F, numbered, respectively, 1009, 1011 are added, an additional NFET 1016 is added to parallel portion 1018, and an additional PFET 1020 is added to stacked or series portion 1022. Thus, output 1012 is grounded whenever any of the inputs 1002, 1004, 1006, 1008, 1009, 1011 is in a "HIGH" state. Output 1012 is connected to voltage supply 1010 only when all inputs 1002, 1004, 1006, 1008, 1009, 1011 are in a "LOW" state.

Discussion will now be presented regarding various aspects of transistor technology that may be pertinent to one or more embodiments of the present invention. The dual-poly gate process (employing an n+ polysilicon gate for NFETS and a p+ polysilicon gate for PFETS) has been widely used to suppress severe short-channel effects (SCEs) in conventional CMOS technologies below 0.25 µm. In contrast, accumulation-mode (or buried-channel) devices, using the single-poly gate process, tend to have much worse short-channel effects. Such devices do, however, offer high carrier mobility as carriers are confined away from the surface and thus do not suffer surface roughness-induced scattering. Double-gate devices may offer enhanced gate control and short-channel effects, such that use of accumulation-mode devices may be viable. That is, it may be possible to overcome the short-channel effects in scaled double-gate accumulation-mode buried-channel devices.

Figure 11:
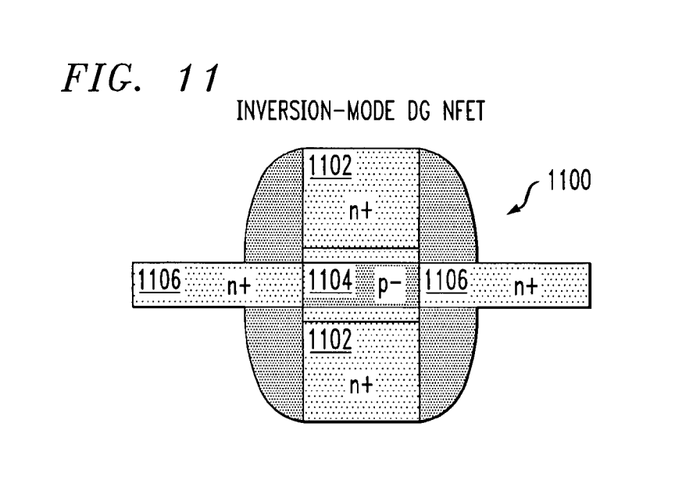
FIG. 11 shows an inversion-mode double-gate NFET useful with one or more embodiments of the present invention.

Referring now to FIG. 11, an inversion-mode double-gate NFET in the form of one type of FinFET structure is shown.

A FinFET is a type of MOSFET built on a silicon-on-insulator (SOI) substrate, on which silicon is etched into a fin-like body for the transistor, and the gate is wrapped around and over the FinFET forming a double-gate structure. As shown in FIG. 11, NFET 1100 includes a body, with n+ regions 1106 and p− region 1104, as well as first and second n+ gates 1102.

Figure 12:
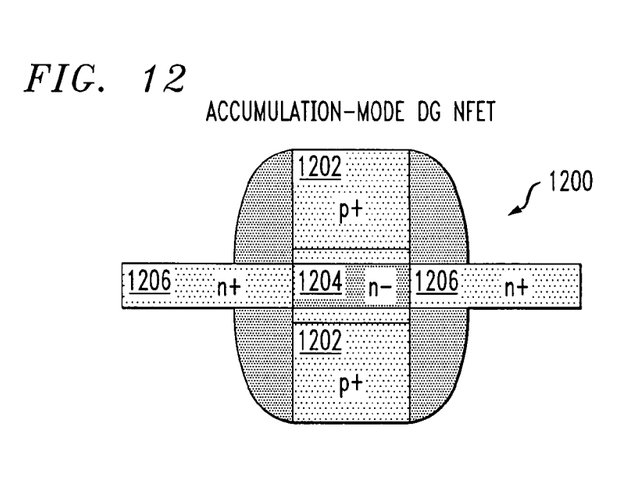
FIG. 12 shows an accumulation-mode double-gate NFET useful with one or more embodiments of the present invention.

Referring now to FIG. 12, one type of accumulation-mode double-gate n-type FinFET 1200 can be formed using p+ gates 1202 and n− region 1204 for the body, with n+ source/drain 1206. It should be noted that an accumulation-mode p-type FinFET could be made using n+ gates and a p− body, with p+ source/drain, while an inversion mode p-type FinFET can be made with a p+ and n− body.

Figure 13:
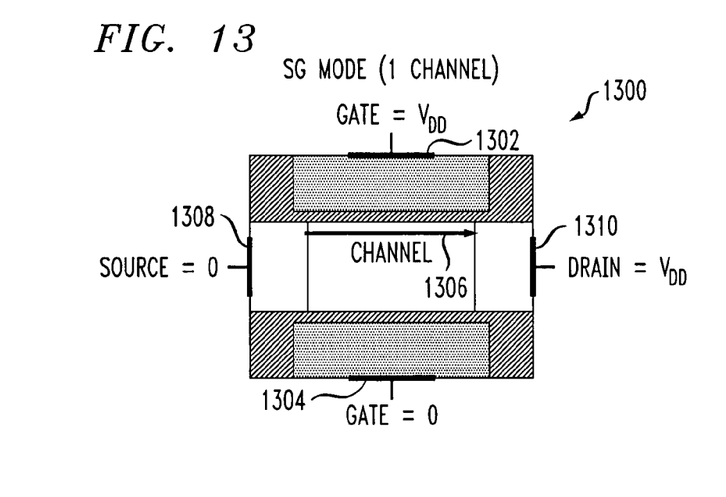
FIG. 13 shows a double-gate FET with only a single gate thereof activated.

Attention should now be given to FIG. 13, which depicts an inversion-mode double-gate device in a single-gate mode, wherein only one conductive channel is present. Device 1300 includes a first gate 1302 held at supply voltage $V_{DD}$ and a second gate 1304 held at a potential of 0 (or ground). A single channel 1306 forms between source 1308 (at 0 or ground potential) and drain 1310 (at $V_{DD}$). In inversion-mode devices, channels such as channel 1306 are close to the surface. Gate-to-gate coupling may be significantly increased for a higher threshold voltage ($V_T$) and $V_{DD}$ due to less inversion charge shielding.

Figure 14:
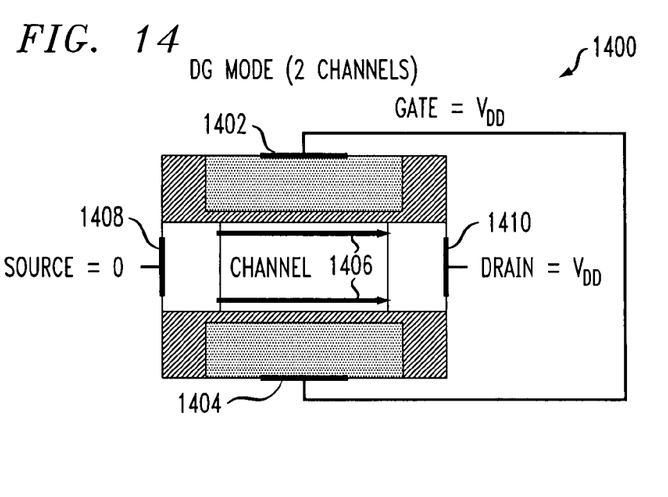
FIG. 14 shows a double-gate FET with both gates thereof activated.

FIG. 14 shows the device of FIG. 13, but in a state where both gates are activated. Specifically, device 1400 includes all the elements in FIG. 13, with the same reference characters incremented by 100, but both gates 1402, 1404 are held at $V_{DD}$, resulting in the formation of two channels 1406.

High-performance low-power CMOS logic should have a ratio of "ON" current to "OFF" current, $$\frac{I_{on}}{I_{off}} \geq 1000.$$

For devices configured with "regular" threshold voltage $V_T$ and supply voltage $V_{DD}$, two surface channels may be independently controlled by front and back gates. The ratio of $I_{on}$ in the double-gate mode to $I_{on}$ in the single-gate mode is $$\frac{I_{on,double}}{I_{on,single}} > 2,$$

where the inequality is approximate, for a regular threshold voltage of approximately 0.35 volts and a regular $V_{DD}$ of approximately one volt. For a high threshold voltage and low $V_{DD}$ device, the device will only be "ON" when operating in the double-gate mode with both gates activated. In this case, the ratio of $I_{on}$ in the double-gate mode to $I_{on}$ in the single-gate mode is $$\frac{I_{on,double}}{I_{on,single}} \approx 1000,$$

with a relatively high threshold voltage of approximately 0.65 volts and a relatively low $V_{DD}$ of approximately 0.6 volts.

Figure 15:
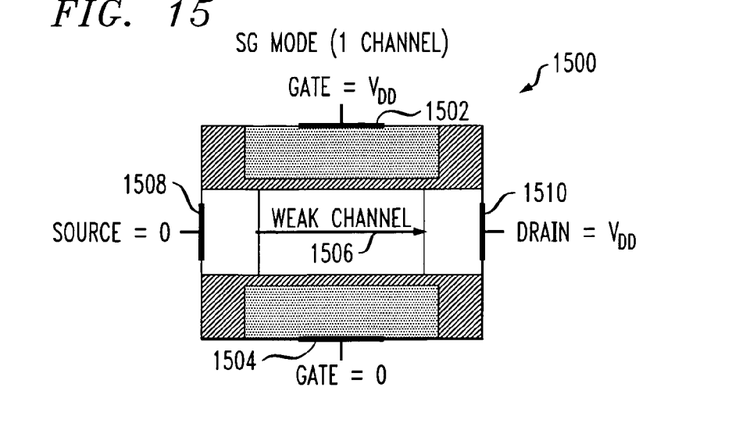
FIG. 15 shows a double-gate FET that is configured to have only a weak channel when only a single gate thereof is activated.

FIG. 15 depicts an accumulation-mode double-gate device 1500 operating in a single-gate mode. Device 1500 includes a first gate 1502 held at supply voltage $V_{DD}$ and a second gate 1504 held at a potential of 0 (or ground). Since only a single gate is activated, only a relatively weak channel 1506 forms between source 1508 held at 0 (or ground) potential and drain 1510 held at $V_{DD}$. In the double-gate accumulation (buried-channel mode), the superior SCEs and gate-to-gate coupling can yield a lower sub-threshold swing (S) and a lower threshold voltage. In accumulation-mode devices, the buried channel is far away from the surfaces, resulting in less surface scattering, and thus higher mobility. In the mode depicted in FIG. 15, the single weak channel 1506 is sufficiently weak such that the device 1500 can still be considered OFF in a logical sense.

Figure 16:
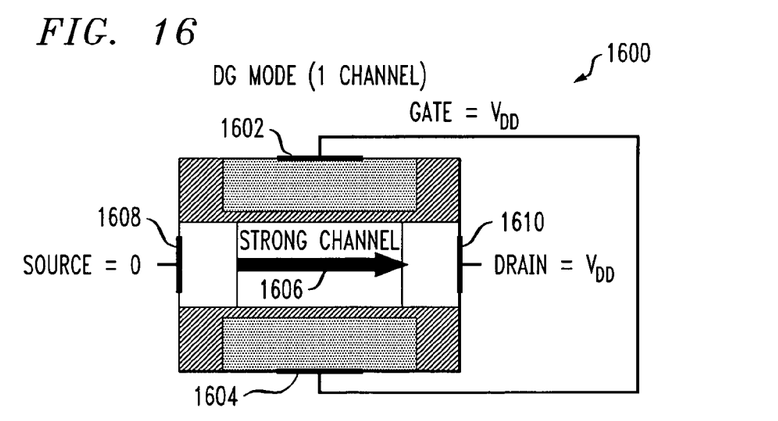
FIG. 16 shows a double-gate FET configured to have a single, strong channel when both gates thereof are activated.

Giving attention now to FIG. 16, a device 1600 is the same as device 1500 but with a supply voltage $V_{DD}$ applied to both gates 1602, 1604. Note that items in FIG. 1600 similar to those in FIG. 1500 have received the same reference character incremented by 100. Here, with both gates having an applied supply voltage, a strong channel 1606 is formed; the single strong channel is in the center of the film and the device is now ON for logical purposes. The ratio of the on current in the double-gate mode to that in the single-gate mode is $$\frac{I_{on,double}}{I_{on,single}} \geq 1000,$$

where the inequality is approximate, due to the threshold voltage in the double-gate mode being much less than the threshold voltage in the single-gate mode.

In view of the foregoing discussion, it will be appreciated that an inversion-mode double-gate device can have its front and back gates biased or turned on independently. The accumulation-mode double-gate device, however, would have a significantly higher threshold voltage than the inversion-mode device. Thus, when only one of gates in a double-gate accumulation-mode device is turned on (that is, single-gate mode) the channel current is still quite small due to the inherently large threshold voltage and large S, and the device may still be considered "OFF" for logic circuit applications. When both gates are turned on (double-gate mode), due to gate-to-gate coupling, the threshold voltage and sub-threshold swing are significantly reduced, a large "ON" current flows threw the device channels, and the device is ON only when both gates are turned on, from the standpoint of practical logic considerations.

The preceding discussion has presented certain exemplary types of transistors which may be advantageously employed in one or more embodiments of the present invention. However, it should be understood that other types of transistors may also be employed. Any transistor that turns ON logically only when the desired number of gates are activated can be used. For example, the same single gate-OFF, double gate-ON characteristics just described could be obtained in symmetrical double-gate devices with a metal gate and, for example, a lightly-doped body. With a near-mid-gap metal gate and a lightly-doped body, the threshold voltage for a PFET would be approximately 300 mV higher than for the NFET. Thus, when only one gate of the PFET was turned on, the device current would still be quite small and the device would be OFF from the standpoint of practical logic considerations. However, when both gates where turned on, the device would be ON due to gate-to-gate coupling, similar to the case of the accumulation-mode double-gate PFET described above. One could also choose a different metal work function to have a high threshold voltage double-gate NFET with turn-on characteristics similar to the accumulation-mode double-gate NFET, and a regular threshold voltage double-gate PFET.

It will be appreciated that in one or more embodiments of a NAND gate (including static and dynamic NAND) according to the present invention, the "parallel" portion could be formed from PFETS, and the series or "stacked" portion could be formed from NFETS having a higher threshold voltage than the PFETS. The NFETS could be accumulation mode (or buried channel or depletion mode), while the PFETS could be inversion mode (or conventional/surface channel). Further, when metal-gate FETS are used, while lightly-doped bodies may be employed in one or more embodiments, undoped, lightly-doped, or heavily-doped bodies may be employed in other embodiments. Polysilicon-gate FETS may also be employed. In one or more exemplary NOR-gate embodiments (including static and dynamic NOR), the "parallel" portion can be formed from NFETS and the series or "stacked" portion can be formed from PFETS having a threshold voltage greater than that of the NFETS. The construction can be complementary to the NAND gate just discussed, i.e., the PFETS can be, e.g., accumulation mode while the NFETS can be, e.g., inversion mode. Again, metal-gate or polysilicon-gate FETS can be employed. Further, the metal-gate FETS may be used with lightly doped bodies in one or more embodiments, but undoped, lightly-doped or heavily-doped bodies can be used in other embodiments, as with the NAND gates.

It will be appreciated that in general, double-gate devices may be used with independent biases on the gates or with the two gates tied together. In one or more exemplary embodiments of the present invention, the device gates are biased separately and the devices in the "parallel" portion of the gate are designed to have a logical ON condition when either gate is active, while the devices in the "series or stacked" portion of the gate are designed to have a logical ON condition only when both gates are activated. Thus, one or more embodiments of the present invention employ series or "stacked" devices having a higher threshold voltage, $V_T$, than the threshold voltage for the parallel devices. It is presently believed that symmetrical double-gate devices which employ identical material(s) for both gates, or the same type of polysilicon, may be more effective than other devices, but the present invention is not limited to such symmetrical devices.

Figure 17:
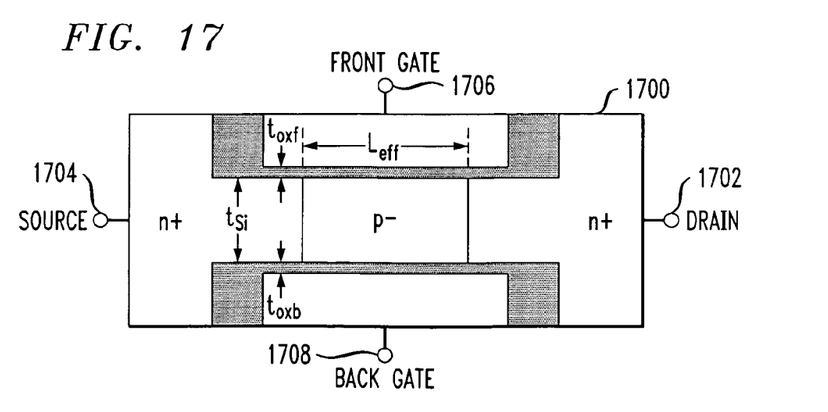
FIG. 17 shows an exemplary FET configuration used in computer simulations of performance of exemplary embodiments of the present invention.

Performance of various exemplary embodiments of the present invention was predicted using the MEDICI software program available from Synopsis, Inc. of Mountain View, Calif. FIG. 17 shows an exemplary symmetrical double-gate NFET configuration 1700 used in performing the simulations. NFET 1700 includes a 25 nm effective channel length $L_{eff}$, a lightly doped body ($N_{body}=10^{15}$ cm$^{-3}$), a thin silicon film ($t_{Si}=9$ nm), a scaled oxide thickness $t_{oxf}=t_{oxb}=1$ nm, and a near-mid-gap gate work function $\Phi_{GfS}=\Phi_{GbS}=4.85$ eV. FIG. 17 is a cross sectional view of device 1700 including drain 1702, source 1704, and front and back gates 1706, 1708 respectively.

Figure 18:
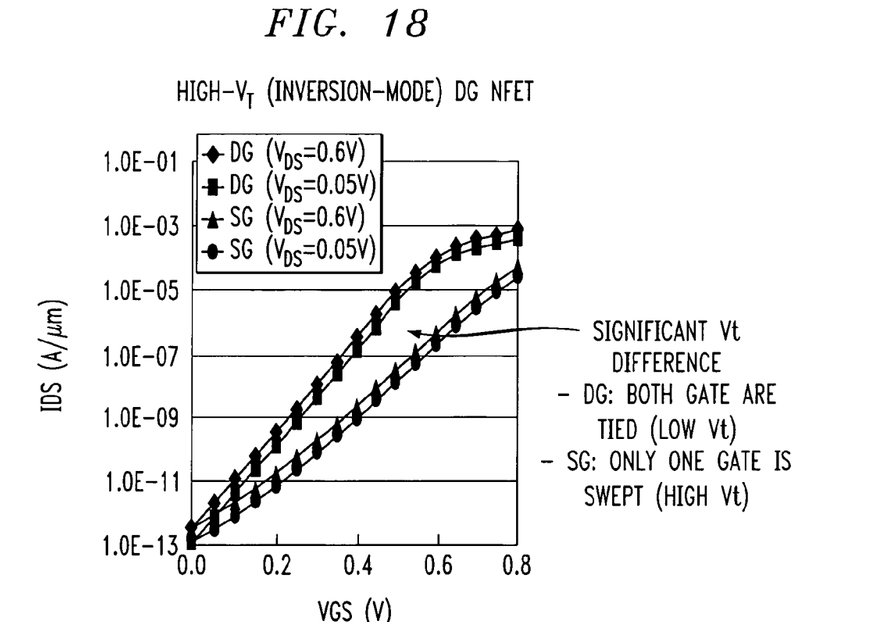
FIG. 18 shows drain-source current versus gate-source voltage characteristics of a high threshold voltage double-gate NFET useful in one or more embodiments of the present invention.

FIG. 18 shows a plot of drain-source current in A/µm versus gate-source voltage differential for four different values of drain-source voltage differential for a high threshold voltage inversion mode double-gate NFET. Note the significant threshold voltage difference; in the double-gate mode, both gates are tied resulting in a low threshold voltage, while in the single-gate mode, only one gate is swept resulting in a high threshold voltage. The two higher curves show the double-gate mode, while the two lower curves show the single-gate mode.

Figure 19:
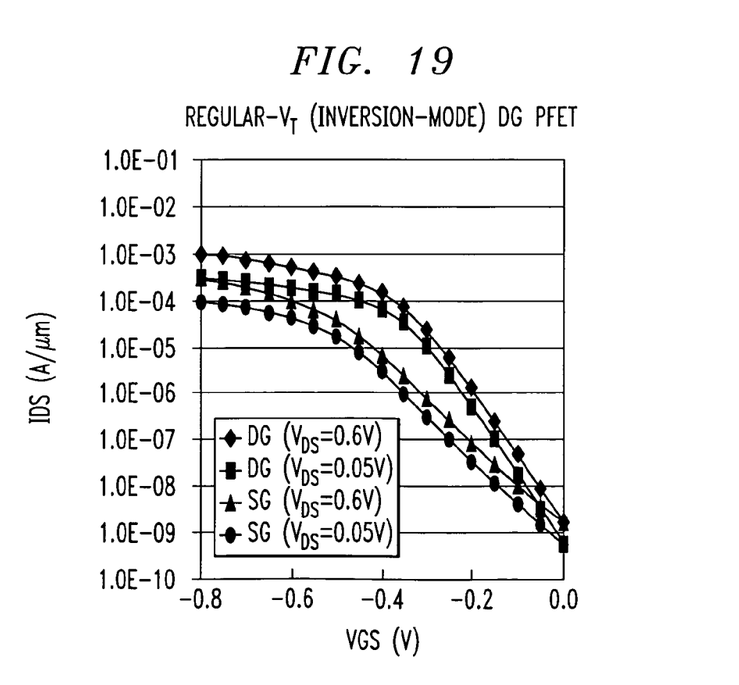
FIG. 19 shows a plot similar to FIG. 18 but for a regular threshold voltage double-gate PFET useful with one or more embodiments of the present invention.

Referring now to FIG. 19, the drain-source current in A/µm is shown plotted against the gate-source voltage for single-gate and double-gate modes and different values of the drain-source voltage differential, for a regular threshold voltage (inversion-mode) double-gate PFET. The high threshold voltage double-gate NFET has a ratio of double-gate ON current to single-gate ON current of $$\frac{I_{on,double}}{I_{on,single}} \approx 1000$$

for lower $V_{DD}$ values. Note also that in a regular threshold voltage device as in FIG. 19, there is a relatively smaller difference between the double-gate and the single-gate modes. The device in FIG. 18 is effectively off when a bias of 0.6 volts is applied to only one gate, while when both gates are turned on, a current of approximately 1000 times greater magnitude results. In the device of FIG. 19, the current in the double-gate mode is only a factor of somewhat greater than 2 higher than that in the single-gate mode. The devices for which the plots are shown in FIGS. 18 and 19 can have the same near-mid-gap gate, resulting in technology simplicity. This simplicity can be achieved by using the threshold voltage modulation technique from the gate-to-gate coupling.

Figure 20:
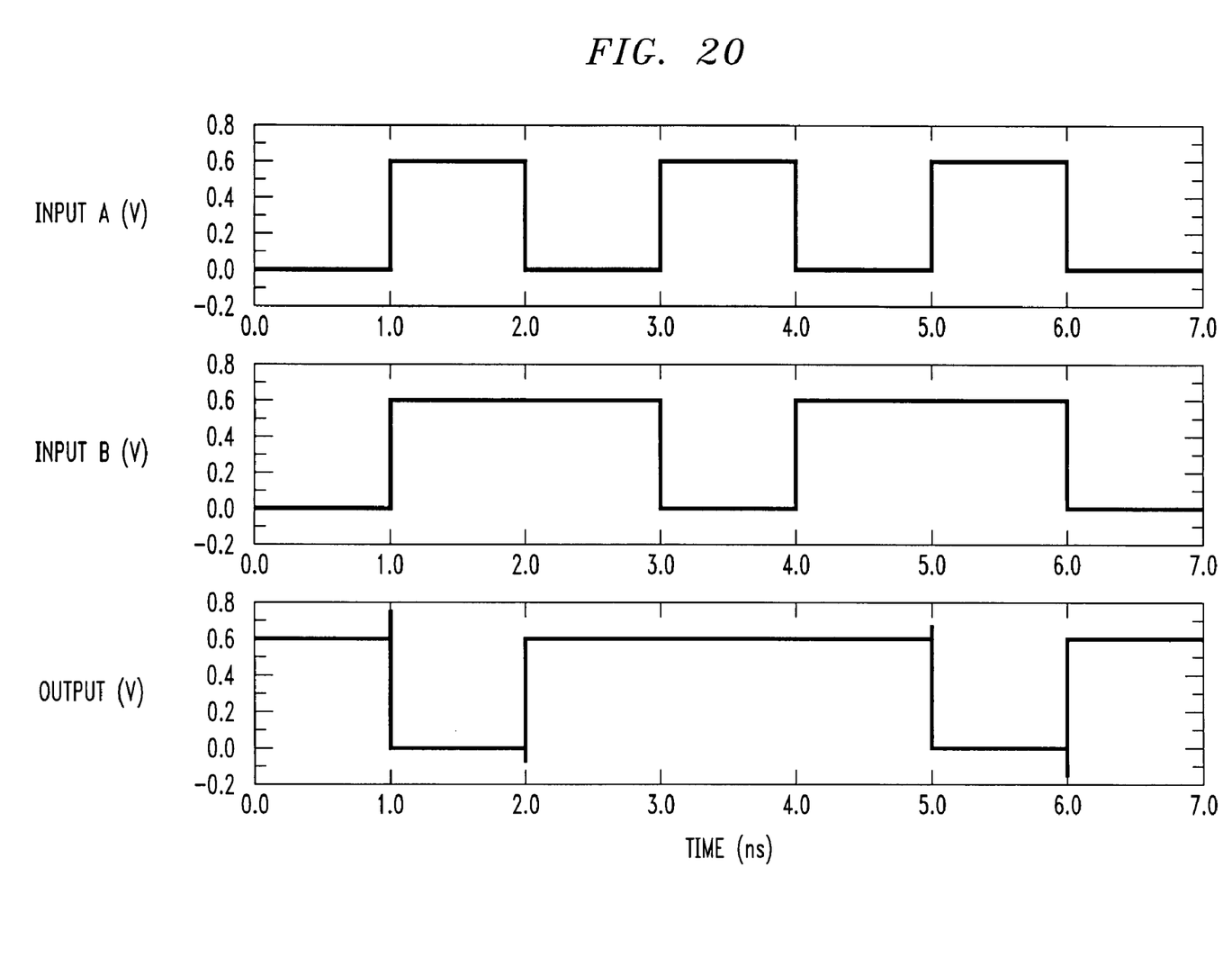
FIG. 20 shows simulated performance for an exemplary embodiment of a two-way NAND gate according to an aspect of the present invention.

FIG. 20 shows simulated waveforms for a two-way NAND device according to an embodiment of the present invention. Note that the circuit is predicted to correctly and reliably perform the NAND function, as the output voltage only goes LOW under conditions when both inputs are HIGH.

Figure 21:
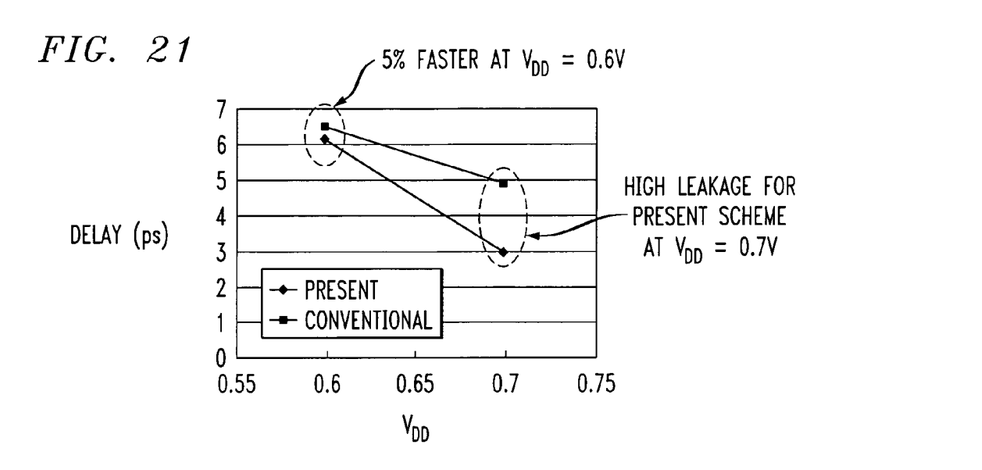
FIG. 21 shows delay in picoseconds versus supply voltage for an exemplary embodiment of a two-way NAND gate, loaded with a similar NAND gate, according to an aspect of the present invention, as well as such delay versus supply voltage characteristics for a conventional two-way NAND gate.

FIG. 21 shows the delay, in picoseconds, versus the supply voltage for an exemplary two-way NAND gate according to an embodiment of the present invention, loaded with a similar NAND gate, as compared to conventional technology. The predicted performance for the exemplary embodiment of the present invention is designated in the figures as "present." At a $V_{DD}$ value of 0.6 volts, the exemplary embodiment is 5% faster. At a $V_{DD}$ of 0.7 volts, high leakage is noted for the exemplary embodiment. Such high channel leakage can result in high standby power. Referring momentarily back to FIG. 18, it can be seen that an order higher leakage is expected when gate bias $V_{GS}$ moves from 0.6 volts to 0.7 volts. It is presently believed that the embodiment of the present invention for which performance is shown in FIG. 21 could realize an over two times reduction in area, using only half the number of transistors of conventional technology and requiring less isolation material and wiring.

Figure 22:
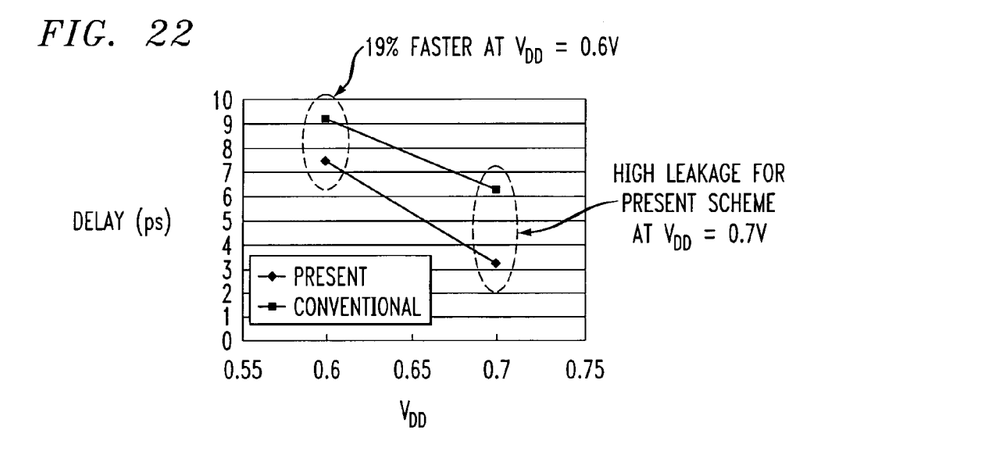
FIG. 22 is a plot similar to FIG. 21 for an exemplary four-way NAND gate according to another aspect of the present invention, in an unloaded state, compared to a conventional four-way NAND gate.

FIG. 22 is a figure similar to FIG. 21, but for an unloaded four-way NAND gate according to one aspect of the present invention (designated as "present" in FIG. 22), compared to conventional technology. The exemplary embodiment results in 19% faster performance at a $V_{DD}$ value of 0.6 volts, with over two times reduction in area, again due to halving the transistor count plus the need for less isolation material and wiring. The performance advantage is potentially greater for NAND or NOR gates with higher stacking, and six-way logic gates, unknown in previous technologies, may be constructed. Similar leakage considerations apply as in the above discussion of FIG. 21.

Figure 23:
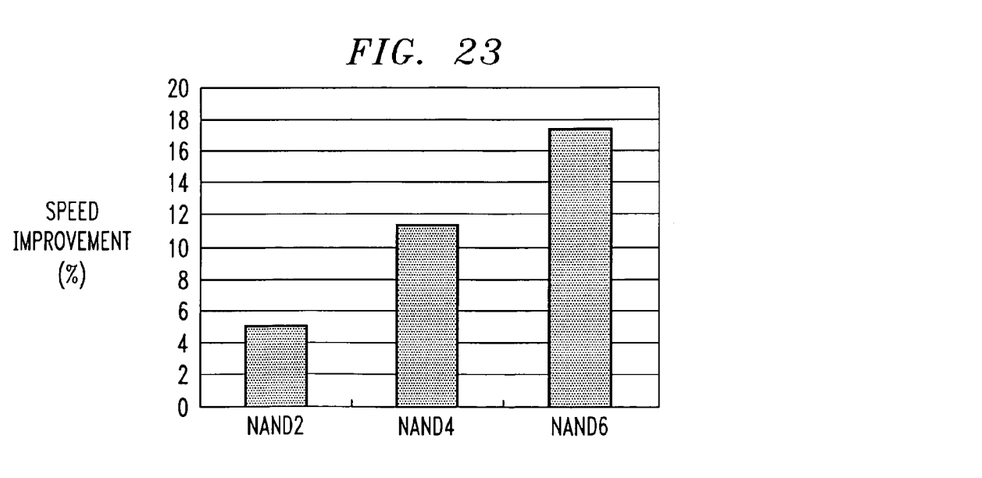
FIG. 23 is a bar chart showing the percentage speed improvement for exemplary embodiments of, respectively, two-way NAND, four-way NAND, and six-way NAND gates according to aspects of the present invention, compared to conventional technologies.

FIG. 23 shows percentage speed improvements, compared to conventional technology, for two-way, four-way, and six-way NAND gates according to exemplary embodiments of the present invention.

Figure 24:
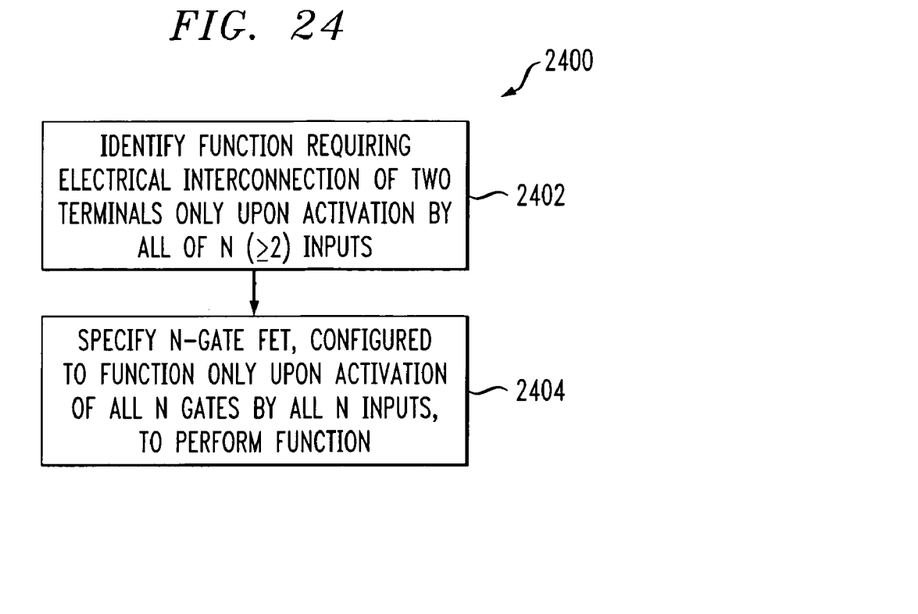
FIG. 24 is a flow chart depicting method steps of an exemplary method of designing a logic gate, according to an aspect of the present invention.

Attention should now be directed to FIG. 24, which depicts a flow chart 2400 showing steps in an exemplary method (which can be computer-implemented) of designing a logic gate, according to an aspect of the present invention. In step 2402, a function requiring electrical interconnection of two terminals only upon activation by all of N inputs is identified. N may have a value greater than or equal to two. In step 2404, a multi-gate FET is specified to perform the function identified in step 2402. The multi-gate FET has a number of gates equal to the number of inputs and is configured to conduct, in a logical sense, only upon activation of all of the gates by all of the inputs. The N-gate FET can, for example, be associated with any of the aspects of the invention discussed above, such as a NAND gate or a NOR gate.

Figure 25:
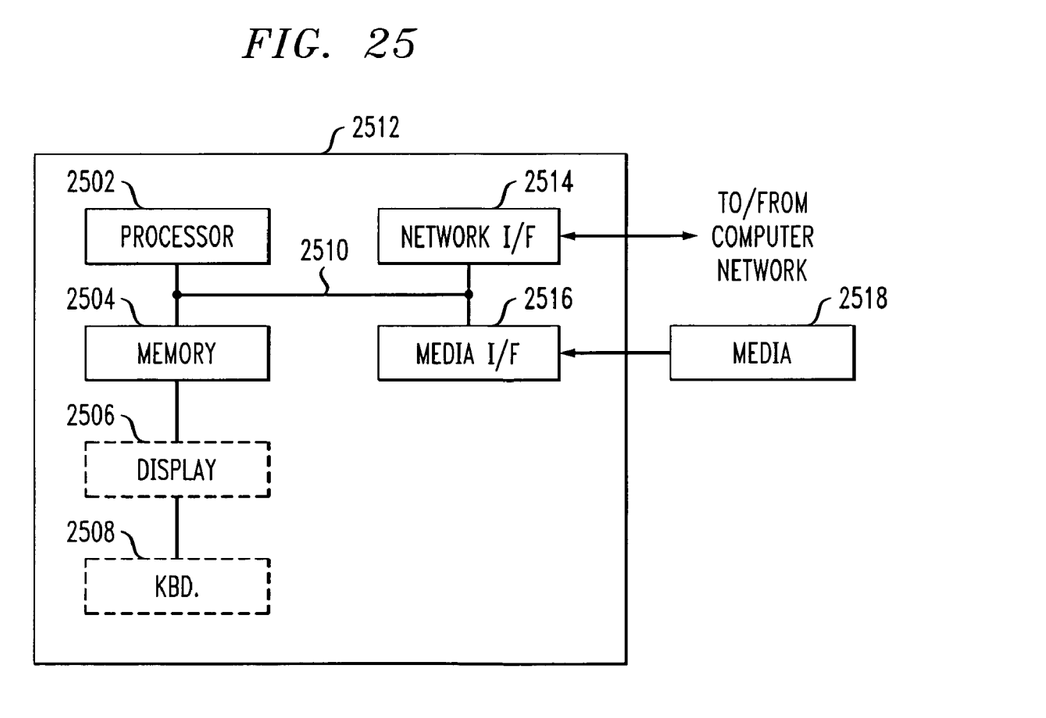
FIG. 25 depicts an exemplary computer system which can be used to implement one or more embodiments of the present invention.

The method can, for example, be implemented in software, which includes but is not limited to firmware, resident software, microcode, etc. With reference to FIG. 25, such alternate implementations might employ, for example, a processor 2502, a memory 2504, and an input/output interface formed, for example, by a display 2506 and a keyboard 2508. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (e.g., hard drive), a removable memory device (e.g., diskette), a flash memory and the like. In addition, the phrase "input/output interface" as used herein, is intended to include, for example, one or more mechanisms for inputting data to the processing unit (e.g., mouse), and one or more mechanisms for providing results associated with the processing unit (e.g., printer). The processor 2502, memory 2504, and input/output interface such as display 2506 and keyboard 2508 can be interconnected, for example, via bus 2510 as part of a data processing unit 2512. Suitable interconnections, for example via bus 2510, can also be provided to a network interface 2514, such as a network card, which can be provided to interface with a computer network, and to a media interface 2516, such as a diskette or CD-ROM drive, which can be provided to interface with media 2518.

Accordingly, computer software including instructions or code for performing the methodologies of the invention, as described herein, may be stored in one or more of the associated memory devices (e.g., ROM, fixed or removable memory) and, when ready to be utilized, loaded in part or in whole (e.g., into RAM) and executed by a CPU. Such software could include, but is not limited to, firmware, resident software, microcode, and the like.

Furthermore, the invention can take the form of a computer program product accessible from a computer-usable or computer-readable medium (e.g., media 2518) providing program code for use by or in connection with a computer or any instruction execution system. For the purposes of this description, a computer usable or computer readable medium can be any apparatus for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid-state memory (e.g. memory 2504), magnetic tape, a removable computer diskette (e.g. media 2518), a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor 2502 coupled directly or indirectly to memory elements 2504 through a system bus 2510. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards 2508, displays 2506, pointing devices, and the like) can be coupled to the system either directly (such as via bus 2510) or through intervening I/O controllers (omitted for clarity).

Network adapters such as network interface 2514 may also be coupled to the system to enable the data processing system to become coupled to other data processing systems or remote printers or storage devices through intervening private or public networks. Modems, cable modem and Ethernet cards are just a few of the currently available types of network adapters.

It should be noted that one or more embodiments of the present invention which employ double-gate FETS may be advantageous for application to logic gates having an even number of inputs. Of course, for odd numbers of inputs, one can still employ the present scheme by, for example, using conventional devices for the last odd FET of each type (p and n) in the gate.

Logic gates according to one more aspects of the present invention may be formed into logic circuits, which may be realized as integrated circuits; thus, at least a portion of the techniques of one or more aspects or embodiments of the present invention described herein may be implemented in an integrated circuit. In forming integrated circuits, a plurality of identical die are typically fabricated in a repeated pattern on a surface of a semiconductor wafer. Each die can include one or more of the gates described herein, and may include other structures or circuits. The individual die are cut or diced from the wafer, then packaged as an integrated circuit. A person of skill in the art will know how to dice wafers and package die to produce integrated circuits. Integrated circuits so manufactured are considered part of the present invention.

Circuits including logic gates as described above can be part of the design for an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end applications to advanced computer products having a display, a keyboard or other input device, and a central processor.

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope of spirit of the invention.

What is claimed is:

1. A logic gate comprising:
at least first, second, third and fourth input terminals;
an output terminal;
a voltage supply terminal;
a ground terminal;
a first portion, said first portion comprising at least one field effect transistor (FET) of a first type, said first type being one of a p-type and an n-type, said first portion being configured to electrically interconnect said output terminal with one of said voltage supply terminal and said ground terminal upon activation via at least one of said first and second input terminals; and
a second portion, said second portion in turn comprising at least one multi-gate FET of a second type, said second type being one of said p-type and said n-type and being different than said first type, said at least one multi-gate FET of said second type having at least a first gate electrically interconnected to said first input terminal and a second gate electrically interconnected to said second input terminal, said at least one multi-gate FET of said second type forming at least a part of a path between said output terminal and another one of said voltage supply terminal and said ground terminal, wherein said part of said path is configured to conduct, in a logical sense, only upon activation of both said first and second gates via both said first and second input terminals;
wherein said FET of said first type and said FET of said second type are both double-gate FETS;
said logic gate is configured as a 4-way NAND gate;
said first type is p-type and said second type is n-type;

a threshold voltage of said double-gate FET of said second type is greater than a threshold voltage of said double-gate FET of said first type;
said first portion further comprises a second double-gate p-type FET (PFET) connected in parallel with said first PFET between said voltage supply terminal and said output terminal, and said first portion is further configured to electrically interconnect said output terminal with said voltage supply terminal upon activation via at least one of said first, second, third and fourth input terminals; and
said second portion further comprises a second double-gate n-type FET (NFET) connected in series with said first NFET, and having a first gate electrically interconnected to said third input terminal and a second gate electrically interconnected with said fourth input terminal, said second portion being configured to electrically interconnect said output terminal with said ground terminal only upon activation of all of said first and second gates of said first NFET and said first and second gates of said second NFET via all of said first, second, third, and fourth input terminals.

2. A logic gate comprising:
at least first, second, third, fourth, fifth and sixth input terminals;
an output terminal;
a voltage supply terminal;
a ground terminal;
a first portion, said first portion comprising at least one field effect transistor (FET) of a first type, said first type being one of a p-type and an n-type, said first portion being configured to electrically interconnect said output terminal with one of said voltage supply terminal and said ground terminal upon activation via at least one of said first and second input terminals; and
a second portion, said second portion in turn comprising at least one multi-gate FET of a second type, said second type being one of said p-type and said n-type and being different than said first type, said at least one multi-gate FET of said second type having at least a first gate electrically interconnected to said first input terminal and a second gate electrically interconnected to said second input terminal, said at least one multi-gate FET of said second type forming at least a part of a path between said output terminal and another one of said voltage supply terminal and said ground terminal, wherein said part of said path is configured to conduct, in a logical sense, only upon activation of both said first and second gates via both said first and second input terminals;
wherein:
said FET of said first type and said FET of said second type are both double-gate FETS;
said logic gate is configured as a 6-way NAND gate;
said first type is p-type and said second type is n-type;
a threshold voltage of said double-gate FET of said second type is greater than a threshold voltage of said double-gate FET of said first type;
said first portion further comprises a second and third double-gate p-type FETS (PFETS) connected in parallel with said first PFET between said voltage supply terminal and said output terminal, and said first portion is further configured to electrically interconnect said output terminal with said voltage supply terminal upon activation via at least one of said first, second, third, fourth, fifth and sixth input terminals; and said second portion further comprises a second and third double n-type FETS (NFETS) connected in series with said first NFET, said second NFET having a first gate electrically interconnected to said third input terminal and a second gate electrically interconnected with said fourth input terminal, said third NFET having a first gate electrically interconnected to said fifth input terminal and a second gate electrically interconnected with said sixth input terminal, said second portion being configured to electrically interconnect said output terminal with said ground terminal only upon activation of all of said first and second gates of said first NFET, said first and second gates of said second NFET, and said first and second gates of said third NFET, via all of said first, second, third, fourth, fifth and sixth input terminals.

3. A logic gate comprising:
at least first, second, third and fourth input terminals;
an output terminal;
a voltage supply terminal;
a ground terminal;
a first portion, said first portion comprising at least one field effect transistor (FET) of a first type said first type being one of p-type, and an n-type, said first portion being configured to electrically interconnect said output terminal with one of said voltage supply terminal and said ground terminal upon activation via at least one of said first and second input terminals; and
a second portion, said second portion in turn comprising at least one multi-gate FET of a second type, said second type being one of said p-type and said n-type and being different than said first type, said at least one multi-gate FET of said second type having at least a first gate electrically interconnected to said first input terminal and a second gate electrically interconnected to said second input terminal, said at least one multi-gate FET of said second type forming at least a part of a path between said output terminal and another one of said voltage supply terminal and said ground terminal, wherein said part of said path is configured to conduct, in a logical sense, only upon activation of both said first and second gates via both said first and second input terminals;
wherein:
said FET of said first type and said FET of said second type are both double-gate FETS;
said logic gate is configured as a 4-way NOR gate;
said first type is n-type and said second type is p-type;
a threshold voltage of said double-gate FET of said second type is greater than a threshold voltage of said double-gate FET of said first type;
said first portion further comprises a second double-gate n-type FET (NFET) connected in parallel with said first NFET between said output terminal and said ground terminal, and said first portion is further configured to electrically interconnect said output terminal with said ground terminal upon activation via at least one of said first, second, third and fourth input terminals; and
said second portion further comprises a second double-gate p-type FET (PFET) connected in series with said first PFET, and having a first gate electrically interconnected to said third input terminal and a second gate electrically interconnected with said fourth input terminal, said second portion being configured to electrically interconnect said output terminal with said voltage supply terminal only upon activation of all of said first and second gates of said first NFET and said first and second gates of said second NFET via all of said first, second, third, and fourth input terminals.

4. A logic gate comprising:
at least first, second, third, fourth, fifth and sixth input terminals;
an output terminal;
a ground terminal;
a first portion, said first portion comprising at least one field effect transistor (FET) of a first type, said first type being one of a p-type and an n-type, said first portion being configured to electrically interconnect said output terminal with one of said voltage supply terminal and said ground terminal upon activation via at least one of said first and second input terminals; and
a second portion, said second portion in turn comprising at least one multi-gate FET of a second type, said second type being one of said n-type and said n-type and being different than said first type, said at least one multi-gate FET of said second type having at least a first gate electrically interconnected to said first input terminal and a second gate electrically interconnected to said second input terminal, said at least one multi-gate FET of said second type forming at least a part of a path between said output terminal and another one of said voltage supply terminal and said ground terminal, wherein said part of said path is configured to conduct, in a logical sense, only upon activation of both said first and second gates via both said first and second input terminals;
wherein:
said FET of said first type and said FET of said second type are both double-gate FETS;
said logic gate is configured as a 6-way NOR gate;
said first type is n-type and said second type is p-type;
a threshold voltage of said double-gate FET of said second type is greater than a threshold voltage of said double-gate FET of said first type;
said first portion farther comprises a second and third double-gate n-type FETS (NFETS) connected in parallel with said first NFET between said ground terminal and said output terminal, and said first portion is further configured to electrically interconnect said output terminal with said ground terminal upon activation via at least one of said first, second, third, fourth, fifth and sixth input terminals; and
said second portion further comprises a second and third double-gate p-type FETS (PFETS) connected in series with said first PFET, said second PFET having a first gate electrically interconnected to said third input terminal and a second gate electrically interconnected with said fourth input terminal, said third PFET having a first gate electrically interconnected to said fifth input terminal and a second gate electrically interconnected with said sixth input terminal, said second portion being configured to electrically interconnect said output terminal with said voltage supply terminal only upon activation of all of said first and second gates of said first PFET, said first and second gates of said second PFET, and said first and second gates of said third PFET, via all of said first, second, third, fourth, fifth and sixth input terminals.

* * * * *